(12) United States Patent
Hellberg

(10) Patent No.: US 8,441,321 B2
(45) Date of Patent: May 14, 2013

(54) MULTI-STAGE AMPLIFIER

(75) Inventor: Richard Hellberg, Huddinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/132,241

(22) PCT Filed: Dec. 9, 2008

(86) PCT No.: PCT/SE2008/051424
§ 371 (c)(1),
(2), (4) Date: Jun. 1, 2011

(87) PCT Pub. No.: WO2010/068152
PCT Pub. Date: Jun. 17, 2010

(65) Prior Publication Data
US 2011/0254628 A1   Oct. 20, 2011

(51) Int. Cl.
*H03F 3/68* (2006.01)
(52) U.S. Cl.
USPC ............................ 330/295; 330/124 R
(58) Field of Classification Search .............. 330/84, 330/126, 124 R, 295
See application file for complete search history.

(56) References Cited

U.S. PATENT DOCUMENTS

| 7,221,219 | B2 * | 5/2007 | Hellberg et al. | 330/124 R |
| 7,262,656 | B2 * | 8/2007 | Shiikuma | 330/124 R |
| 7,295,065 | B2 * | 11/2007 | Shah et al. | 330/124 R |
| 8,130,043 | B2 * | 3/2012 | Arell | 330/302 |
| 2003/0076166 | A1 | 4/2003 | Hellberg | |
| 2003/0076167 | A1 | 4/2003 | Hellberg | |
| 2003/0137346 | A1 | 7/2003 | Hellberg | |
| 2004/0051583 | A1 | 3/2004 | Hellberg | |
| 2004/0109512 | A1 | 6/2004 | Fonden et al. | |
| 2004/0135630 | A1 | 7/2004 | Hellberg | |
| 2004/0263242 | A1 | 12/2004 | Hellberg | |
| 2005/0248401 | A1 | 11/2005 | Hellberg et al. | |
| 2005/0280466 | A1 * | 12/2005 | Gailus et al. | 330/124 R |
| 2006/0017500 | A1 | 1/2006 | Hellberg | |
| 2006/0114060 | A1 | 6/2006 | Hellberg et al. | |
| 2007/0080747 | A1 | 4/2007 | Klingberg et al. | |
| 2008/0007330 | A1 | 1/2008 | Klingberg et al. | |

(Continued)

FOREIGN PATENT DOCUMENTS

| JP | 2007-282122 A | 10/2007 |
| JP | 2009-260658 A | 11/2009 |

(Continued)

OTHER PUBLICATIONS

International Search Report corresponding to PCT Application No. PCT/SE2008/051424, Date of Mailing: Jul. 6, 2009.

(Continued)

*Primary Examiner* — Henry Choe
(74) *Attorney, Agent, or Firm* — Myers Bigel Sibley & Sajovec, P.A.

(57) ABSTRACT

The disclosed multi-stage amplifier (200) comprises several amplifier stages (201-203) which, together with an output network, form different branches. A first branch comprises a first and a second amplifier (201, 202) having their outputs connected to each other via a quarter-wave transmission line. The first branch is connected to a load via a first offset-transmission-line (0.1). A second branch comprises a third amplifier stage (203) and a second offset-transmission line (0.22) which are also connected to the load.

17 Claims, 8 Drawing Sheets

U.S. PATENT DOCUMENTS

| | | |
|---|---|---|
| 2009/0021301 A1 | 1/2009 | Hellberg et al. |
| 2010/0019843 A1 | 1/2010 | Hellberg et al. |
| 2010/0244949 A1 | 9/2010 | Gustavsson et al. |
| 2011/0163814 A1 | 7/2011 | Hellberg |
| 2011/0254628 A1 | 10/2011 | Hellberg |
| 2011/0254629 A1 | 10/2011 | Hellberg |

FOREIGN PATENT DOCUMENTS

| | | |
|---|---|---|
| WO | WO 03/061115 A1 | 7/2003 |
| WO | WO 2004/023647 A1 | 3/2004 |
| WO | WO 2004/057755 A1 | 7/2004 |
| WO | WO 2005/031966 A1 | 4/2005 |
| WO | WO 2007/117189 A1 | 10/2007 |

OTHER PUBLICATIONS

Written Opinion of the International Searching Authority corresponding to PCT/SE2008/051424, Date of Mailing: Jul. 6, 2009.

Notification of Transmittal of the International Preliminary Report on Patentability corresponding to PCT/SE2008/051424, Date of Mailing: Mar. 23, 2011.

Doherty "A New High Efficiency Power Amplifier for Modulated Waves" *Proceedings of the Institute of Radio Engineers*, 24(9), pp. 1163-1182, Sep. 1936.

Chireix "High Power Outphasing Modulation" *Proceedings of the Institute of Radio Engineers*, 23(11), pp. 1370-1392, Nov. 1935.

Japanese Office Action Corresponding to Japanese Patent Application No. 2011-539474; Date of Mailing: Nov. 26, 2012; 3 pages (Foreign Text Only).

Japanese Decision to Grant Corresponding to Japanese Patent Application No. 2011-539474; Mailing Date: Mar. 15, 2013; 3 pages (Foreign Text Only)

* cited by examiner

MULTI-STAGE AMPLIFIER

CROSS REFERENCE TO RELATED APPLICATION

This application is a 35 U.S.C. §371 national stage application of PCT International Application No. PCT/SE2008/051424, filed on 9 Dec. 2008, the disclosure and content of which is incorporated by reference herein in its entirety. The above-referenced PCT International Application was published in the English language as International Publication No. WO 2010/068152 A1 on 17 Jun. 2010.

FIELD OF THE INVENTION

The invention relates to an apparatus and system for amplifying signals, and more particularly to an apparatus and system including multi-stage amplifiers.

BACKGROUND

Chireix and Doherty amplifiers were the first examples of RF amplifiers based on multiple transistors with passive output network interaction and combination that gave high average efficiency for amplitude-modulated signals.

FIG. 1A shows a Chireix amplifier 10, which is called an "outphasing" system. The Chireix amplifier 10 uses a signal separator 12 to divide an input signal $S_{in}(t)$ including amplitude and phase modulation into two constant envelope phase-modulated branch signals $S_1(t)$ and $S_2(t)$. The divided branch signals are amplified by respective similar power amplifiers (PA) 16A and 16B, and a power combiner 18 sums the branch signals to produce an amplified version of the input signal having a magnitude based on the phase difference between them. This combined signal is provided to an output load $R_L$, such as an antenna or other load device. For example, if $S_{in}(t)=A(t)$, then $S_1(t)=\cos[\omega t+\cos^{-1}[A(t)]]$, $S_2(t)=\cos[\omega t-\cos^{-1}[A(t)]]$, and $S_1(t)+S_2(t)=2A(t)\cos(\omega t)$. If the PAs 16A and 16B have the same gain G, the output signal would be $S_1(t)+S_2(t)=2GA(t)\cos(\omega t)$. Because PAs 16A and 16B operate at a fixed power level (fixed amplitude), they can be highly non-linear.

FIG. 1B depicts a two-stage Doherty amplifier, which combines dissimilar, but linear PAs called a "main" (carrier) PA 26A and an auxiliary (peaking) PA 26B. The outputs of the PAs 26A and 26B are combined through a transmission line coupler 28 A. A quarter-wave line 28B on the input of the auxiliary PA 26B compensates for the quarter-cycle phase shift in the transmission line on the output of main PA 26A. At low output levels, the drive to the auxiliary PA 26B is cut off, typically at 6 dB from the maximum composite power, and the main PA 26 A operates as a linear class-B amplifier. The impedance presented to the main amplifier 26A by the coupler 28A saturates the main amplifier 26A at a point well below the system peak output power. This results in maximum amplifier efficiency at the transition point and the system peak output power, and high average efficiency for full-carrier AM signals.

Multiple transistor amplifiers based on passive output network interaction structures have the general advantage of needing only fundamental (RF) frequency network and signal modifications. Compared with single-transistor amplifiers, they differ only in the number of independently driven transistors. Harmonics and/or baseband modifications, which are required for other high-efficiency amplifiers, are optional.

The field was generalized for two-transistor structures in U.S. Patent Application Publication Nos. 2003137346 and 2004051583 and three basic expandable multi-transistor structures (and ways to drive them efficiently) International patent application WO2004/023647, International patent application WO2004/057755, and International patent application WO2004SE01357 have been patented. These structures are sufficient to provide all combinations of Doherty and Chireix features. (For a detailed description of background and developments refer to the referenced documents.)

Existing solutions to the problem of combining Chireix amplifiers calls for either connecting several Chireix pairs to the same output or putting them in a Doherty structure. For optimal utilization of the transistors, this requires certain specific relations between the sizes of the transistors. These relations may be hard to combine with available transistor sizes without output power overhead.

Another consideration is that, although the previously invented Chireix/Chireix and Chireix/Doherty combination structures are sufficient for building amplifiers with very high efficiency for all conceivable multi-carrier and multi-user signals, the new structures disclosed herein present another way to increase amplified signal efficiency.

Another problem is that of transistor shunt loss. This loss is due to resistive parasitics that couple from the output node (drain, collector) of the devices to ground (source, emitter), and is proportional to the node voltage squared. Thus, the problem of shunt loss is exacerbated by the operation of the multi-transistor amplifiers, which decrease the transistors' RF output currents (which is the reason for their high efficiency) at the expense of increased RF output voltages. High RF voltages give high loss in the shunt parasitic resistance, and this loss power is higher relative to the output power at low and medium outputs. In other words, the shunt loss degrades efficiency more at low outputs for these types of multi-transistor amplifiers.

SUMMARY

Embodiments in accordance with the invention generally relate to a high efficiency multi-stage amplifier. In some embodiments of the invention, a multi-stage amplifier structure comprises a first branch, which is connected to an output node and includes at least two transistors. The two transistors are connected to one another with a quarter wavelength transmission line or circuit equivalent of a quarter wavelength transmission line. The multi-stage amplifier also includes a second branch including at least one transistor connected to the output node. The second branch includes a partial wavelength transmission line or circuit equivalent of the partial wavelength transmission line connected between the transistor and the output node.

In some embodiments of the invention, a multi-stage amplifier may each include more than one branch having two transistors connected to one another with a quarter wavelength transmission line or circuit equivalent of a quarter wavelength transmission line.

Due to the relation of voltage to current over a quarter wavelength line, the output of the transistor in the first branch may have a parabolic, sub-linear RF voltage. This lower voltage at the output reduces shunt loss while achieving high efficiency.

It is to be understood that both the foregoing general description and the following detailed description are exemplary and exemplary only and are not restrictive of the invention, as claimed.

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention. In the drawings.

DETAILED DESCRIPTION

Figure 1A:
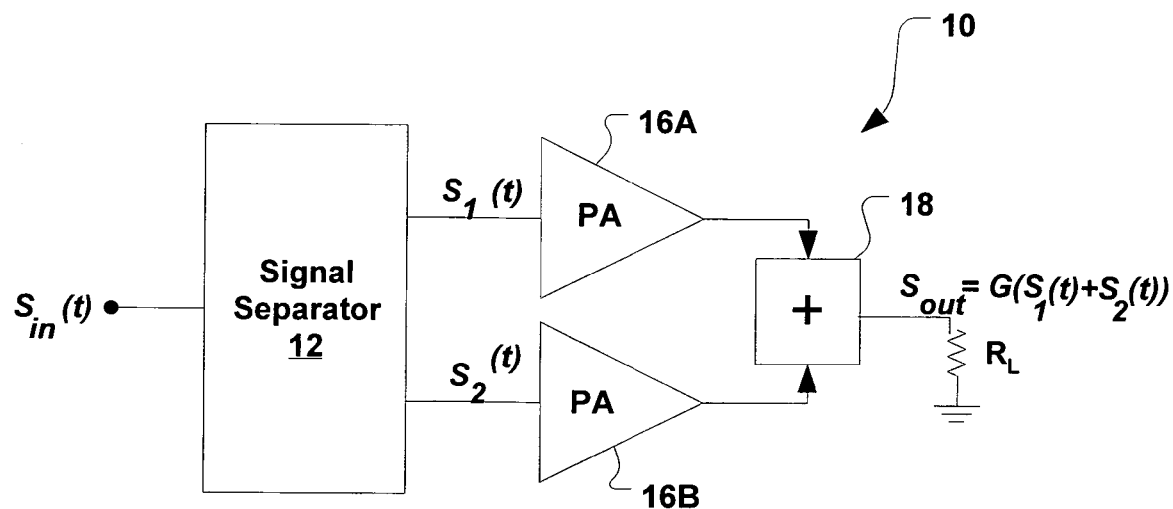
FIG. 1a is a block diagram of a Chireix composite power amplifier configuration.
Figure 1B:
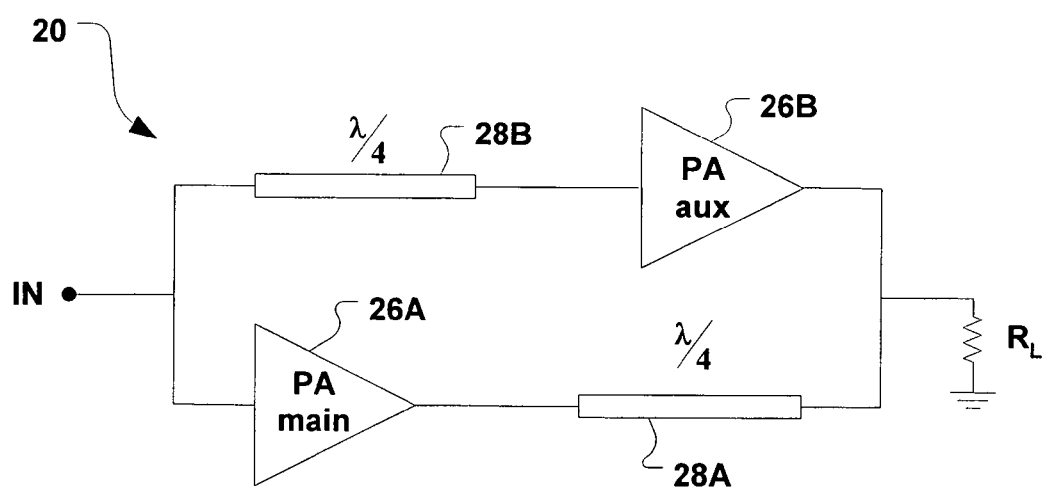
FIG. 1b is a block diagram of a Doherty composite power amplifier configuration.

The various aspects are described hereafter in greater detail in connection with a number of exemplary embodiments to facilitate an understanding of the invention. However, the invention should not be construed as being limited to these embodiments. Rather, these embodiments are provided so that the disclosure will be thorough and complete, and will fully convey the scope of the invention to those skilled in the art.

Further, it should be emphasized that the terms "comprises" and "comprising," when used in this specification, are taken to specify the presence of stated features, integers, steps or components; but the use of these terms does not preclude the presence or addition of one or more other features, integers, steps, components or groups thereof.

This document describes high-efficiency amplifiers based on multiple transistor configurations with new output network structures. These output networks differ from the ones described in International patent application WO2004/023647, International patent application WO2004/057755, and International patent application WO2004SE01357 by having at least one branch with at least two transistors, wherein the two transistors are connected by a quarter wavelength transmission line or equivalent circuit.

If the outer transistor (or transistor network complex) of the branch including the two transistors is a part of a Chireix action, its RF current is largely parabolic (i.e., sub-linear) with respect to the output amplitude. Due to the relation of voltage to current over a quarter wavelength line, the inner transistor will then have a parabolic, sub-linear RF voltage at its output. This lower voltage compared to that of a regular Chireix-Doherty, Chireix-Chireix, etc. configuration results in less shunt loss, and therefore achieves higher efficiency.

The invention enables another effect that also lowers the shunt loss. The voltage amplitude at some transistors that provide current mainly in the upper output amplitude range ("inner" transistors) is constant at output amplitudes above a certain level. Since this voltage must be reflected in the RF current of the outer transistor, this will also be constant at output amplitudes above that level. This means that for amplifiers built to have this effect, the transistors that are active at the lowest output amplitudes can be very small, which in turn means that the parasitic shunt loss is small.

The invention will be described with respect to three exemplary embodiments, although it will become apparent to those skilled in the art that concepts described above and elsewhere herein may be applied in additional embodiments. The first exemplary embodiment demonstrates how sub-linear voltage amplitude (vs. output amplitude) reduces shunt loss at a transistor in a three-transistor amplifier. The second exemplary three-transistor embodiment demonstrates how current limitation at a transistor reduces its size, and therefore losses, compared to prior art. The third exemplary embodiment demonstrates both effects in a single four-transistor amplifier. These exemplary embodiments are described hereafter in greater detail.

Figure 2:
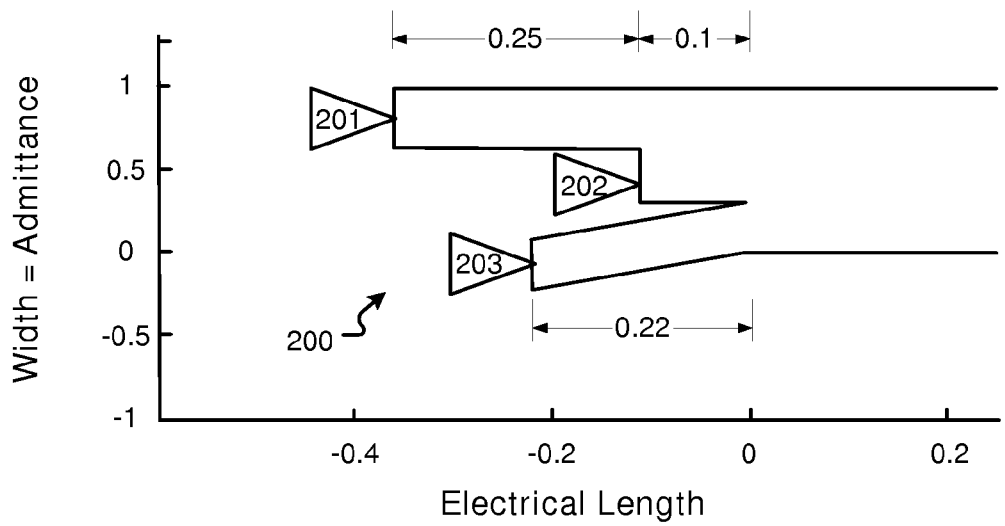
FIG. 2 is a high level diagram of a connection structure of a multi-stage amplifier according to an exemplary embodiment of the invention.

FIG. 2 is a high level structure diagram of an amplifier 200 according to the first exemplary embodiment. As shown in FIG. 2, each amplifier is represented by a symbol (i.e., a triangle) 201-203, each of which may represent an RF transistor, for example, an RF metal oxide semiconductor field effect transistor (MOSFET), metal semiconductor field effect transistor (MESFET), bipolar junction transistor (BJT) or heterojunction bipolar transistor (HBT), along with all necessary tuned circuitry. For example, an amplifier may include a single transistor in GE (GS) configuration and may include an RF tank circuit, a DC block capacitor, harmonic terminations etc. The wide line extending indefinitely to the right from electrical length 0 represents the load, which may be an antenna or a transmission line terminated in an antenna. The structure is normalized to a 1 ohm load and 1 volt maximum RF voltage. Amplifier 200 includes a basic structure in which a first outer transistor 201 is connected to a second inner transistor 202 via a quarter (0.25) wavelength transmission line and an inner transistor 202 connected to the output (at electrical length zero) via a 0.1 wavelength transmission line. Chireix action between the first transistor 201 and a third transistor 203 is obtained by connecting the third transistor 203 to the output via a 0.22 wavelength transmission line. Transmission lines may in practice be replaced by equivalent circuits, such as single or cascaded pi-, T-, or L-networks.

Figure 3A:
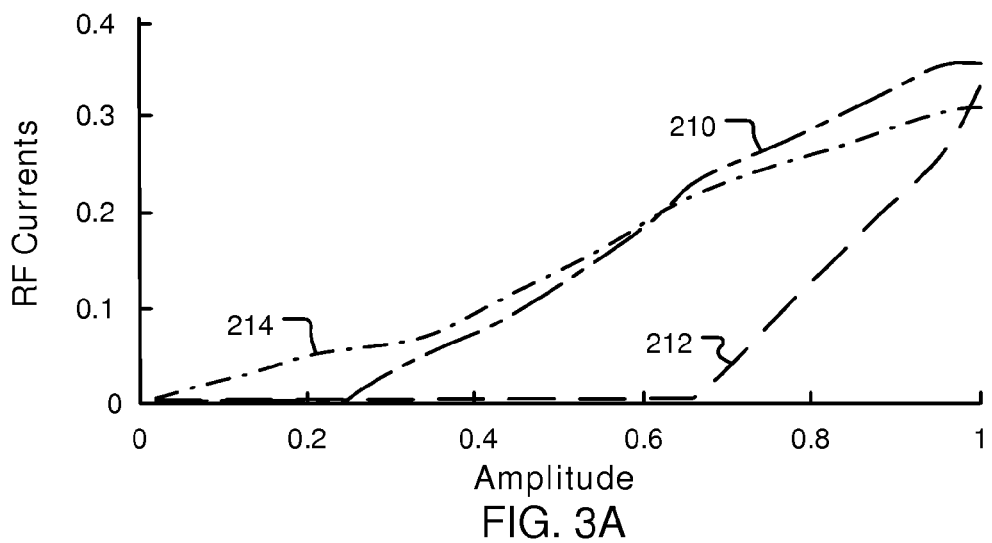
FIGS. 3A-3D are diagrams showing the amplitudes and phases of output currents and voltages from the individual amplifiers of FIG. 2.
Figure 3B:
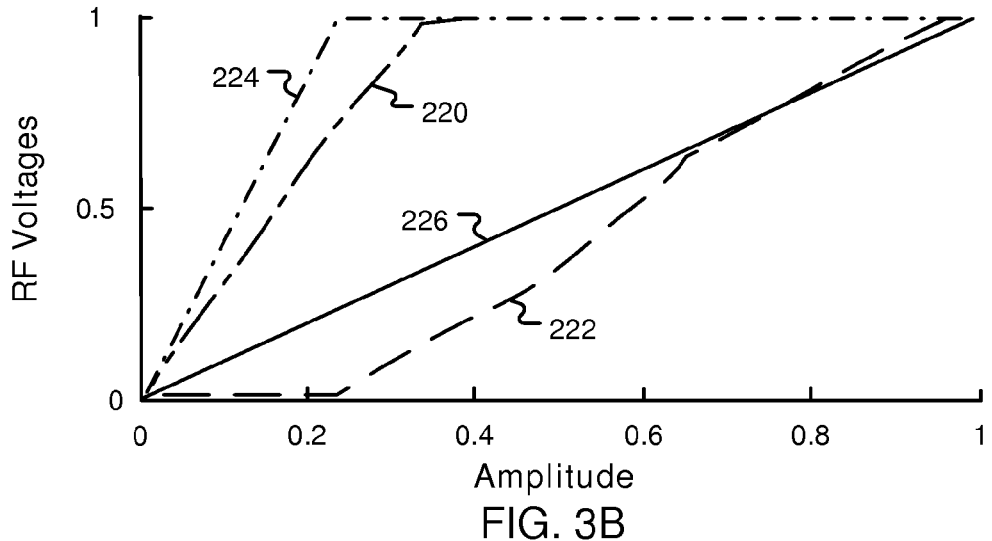

FIGS. 3A and 3B respectively show diagrams of the voltages and current amplitudes of the individual transistors 201-203 across the output amplitudes of the amplifier 200. In FIG. 3A, curve 210 represents output current from transistor 201, curve 212 represents output current from transistor 202, and curve 214 represents output current from transistor 203. In FIG. 3B, curve 220 represents output voltage from transistor 201, curve 222 represents output voltage from transistor 202, and curve 224 represents output voltage from transistor 203. Curve 226 represents the linear output voltage amplitude.

Figure 3C:
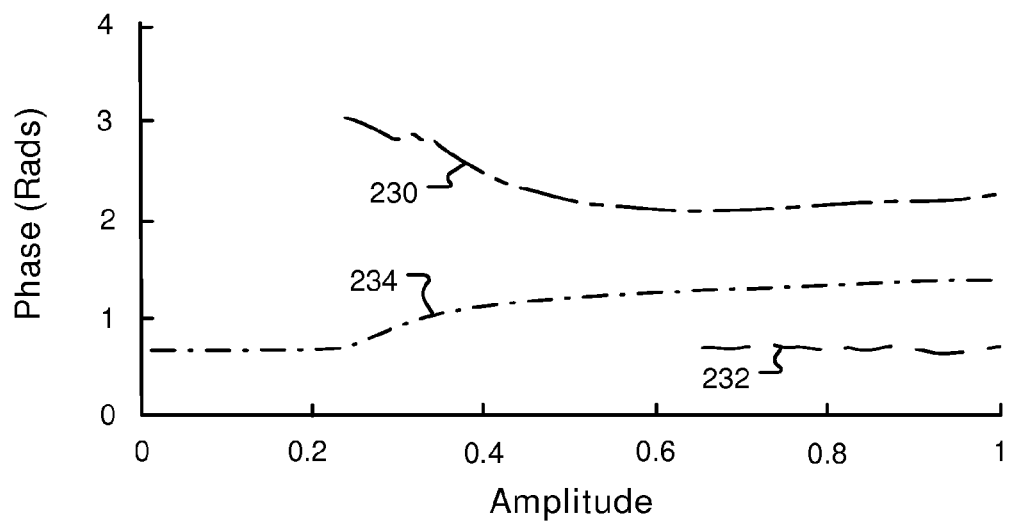
Figure 3D:
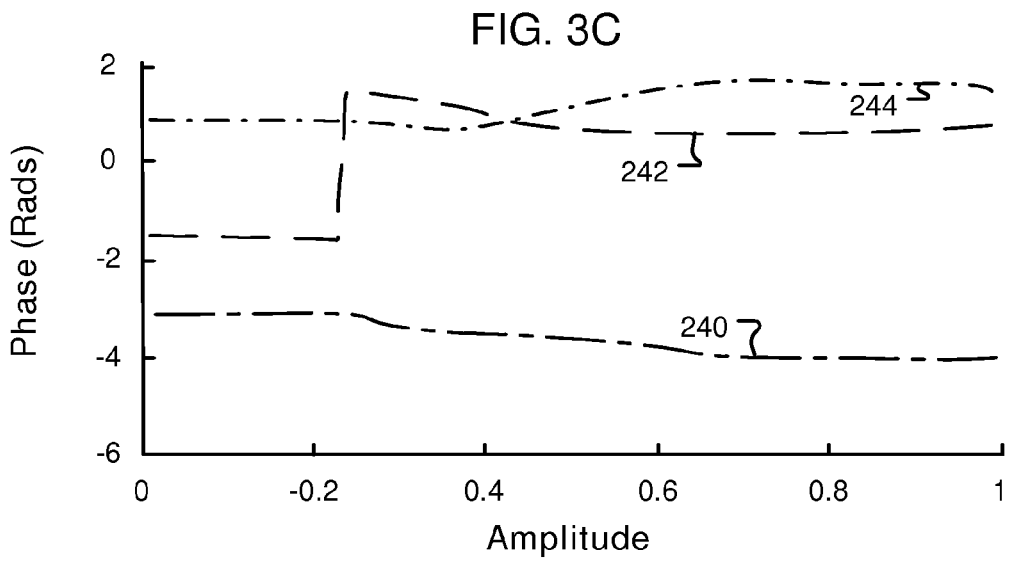

FIGS. 3C and 3D are diagrams showing the phases (in radians) of the current and voltages shown in FIGS. 3A and 3B. Curve 230 represents the phase of the current output from transistor 201, curve 232 represents the phase of current output from transistor 202, and curve 234 represents the phase of the current output from transistor 203.

Figure 4:
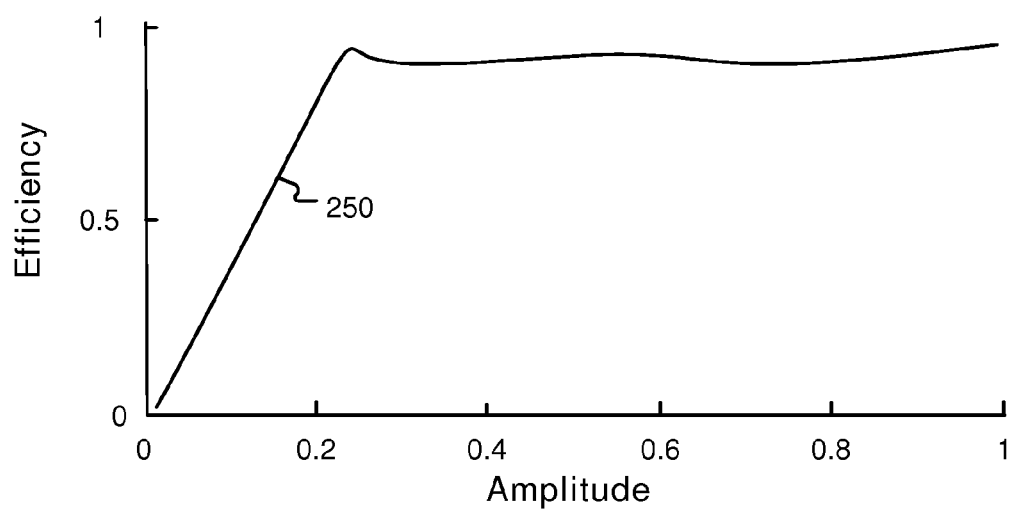
FIG. 4 is a diagram showing the efficiency of the multi-stage amplifier of FIG. 2, as a function of the output voltage amplitude.

FIG. 4 depicts a diagram of the relative efficiency 250 (based on a linear RF current to DC current relationship). As can be seen in FIG. 4, high efficiency 250 is obtained over a wide range of output amplitudes, and FIGS. 3A-3C show that the amplifier 200 has Chireix action between transistors 201 and 203 at amplitudes up to approximately 0.7 of maximum output. The amplifier 200 was deliberately detuned so that the first transistor 201 outputs as little current as possible in the lowest range. The RF voltage amplitude at the middle (inner) transistor 202 is consequently as low as possible, well below linear output voltage amplitude 226 at amplitudes up to approximately 0.7. Compared with a prior art Chireix-Doherty system International patent application WO2004/057755, the amplifier 200 suffers less efficiency degradation at low output amplitudes when shunt loss at transistor outputs is high.

Figure 5:
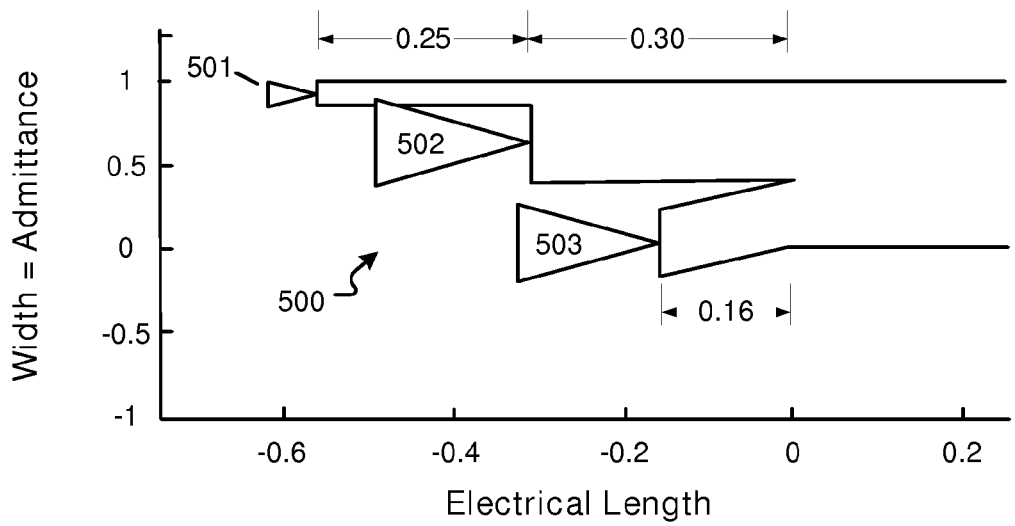
FIG. 5 is a high level diagram of the connection structure of a multi-stage amplifier according to another exemplary embodiment.

The second exemplary embodiment is shown in FIG. 5, which is high level diagram of an amplifier 500 according to some exemplary embodiments. As shown in FIG. 5, a first outer transistor 501 is connected to a second inner transistor 502 via a quarter (0.25) wavelength line, and the second inner transistor 502 is connected to the output via a 0.3 wavelength line. In this amplifier 500, Chireix action takes place between the second transistor 502 and a third transistor 503, which is connected to the output via a 0.16 wavelength line.

Figure 6A:
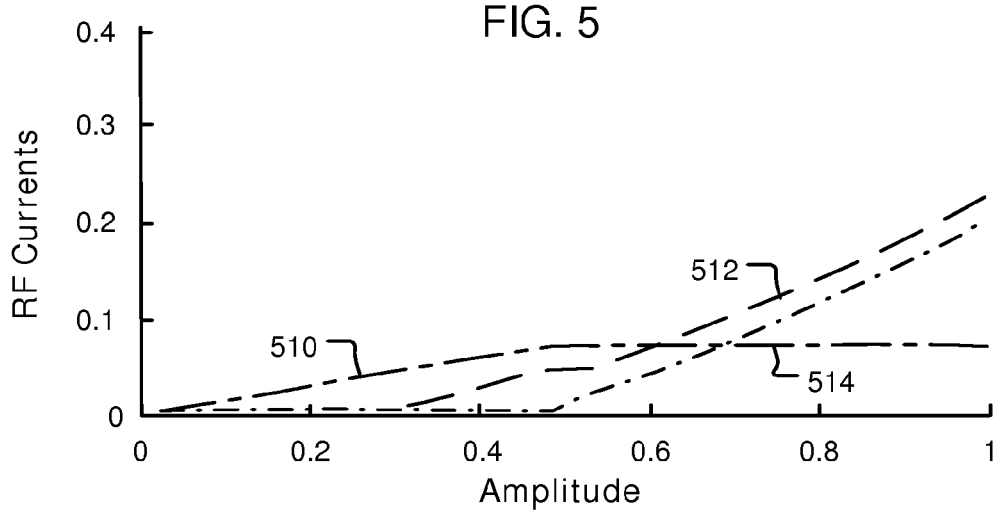
FIGS. 6A-6D are diagrams showing the amplitudes and phases of output currents and voltages from the individual amplifiers of FIG. 5.
Figure 6B:
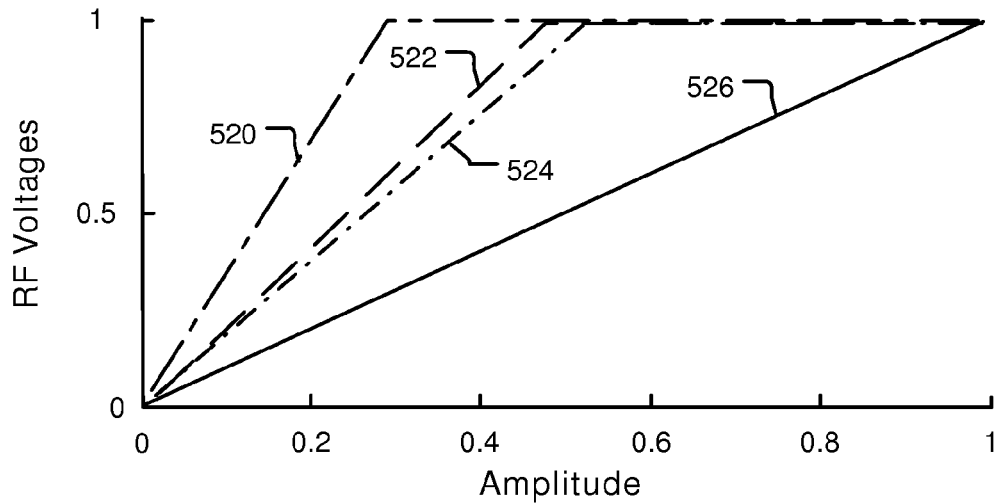

FIGS. 6A and 6B respectively show diagrams of the voltages and current amplitudes of the individual transistors 501-503 across the output amplitudes of the amplifier 500. In FIG. 6A, curve 510 represents output current from transistor 501, curve 512 represents output current from transistor 502, and curve 514 represents output current from transistor 503. In FIG. 6B, curve 520 represents output voltage from transistor 501, curve 522 represents output voltage from transistor 502, and curve 524 represents output voltage from transistor 503. Curve 526 represents the linear output voltage amplitude.

Figure 6C:
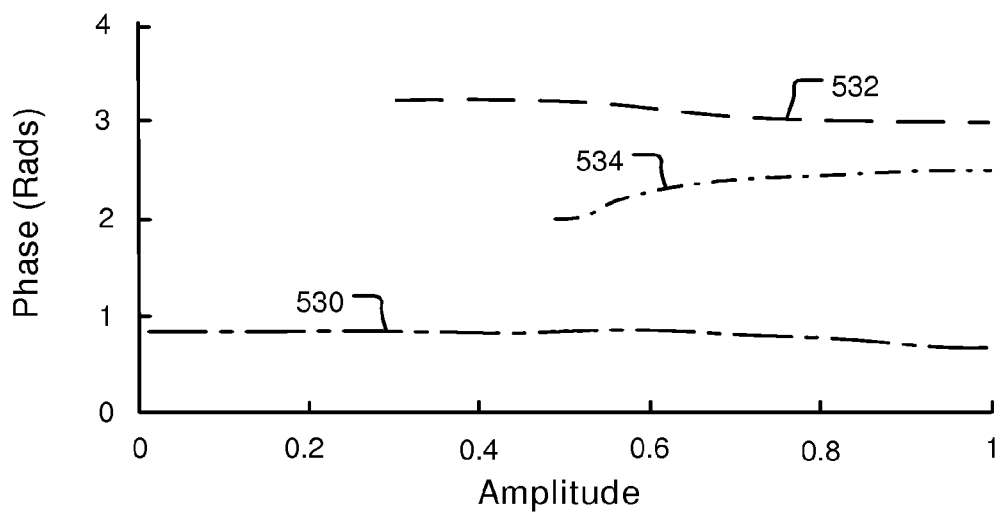
Figure 6D:
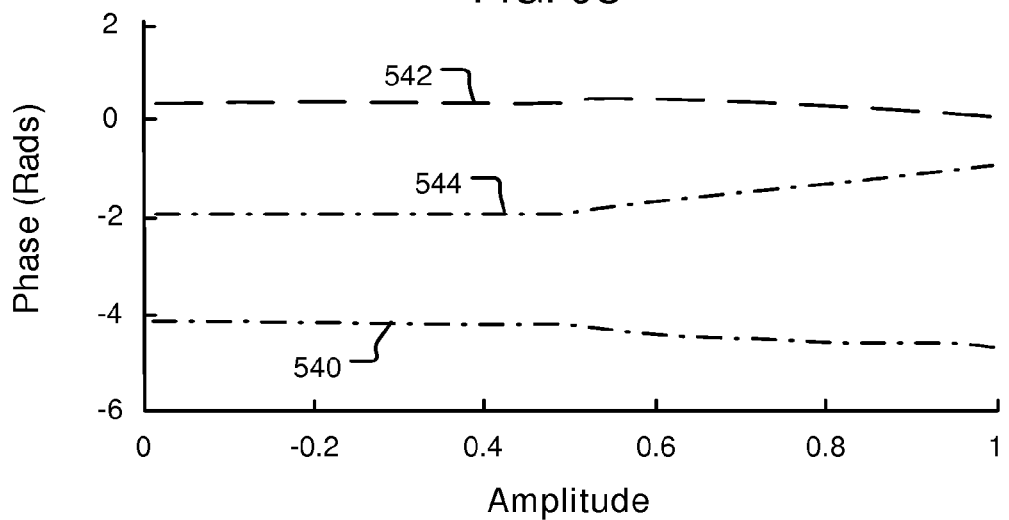
Figure 7:
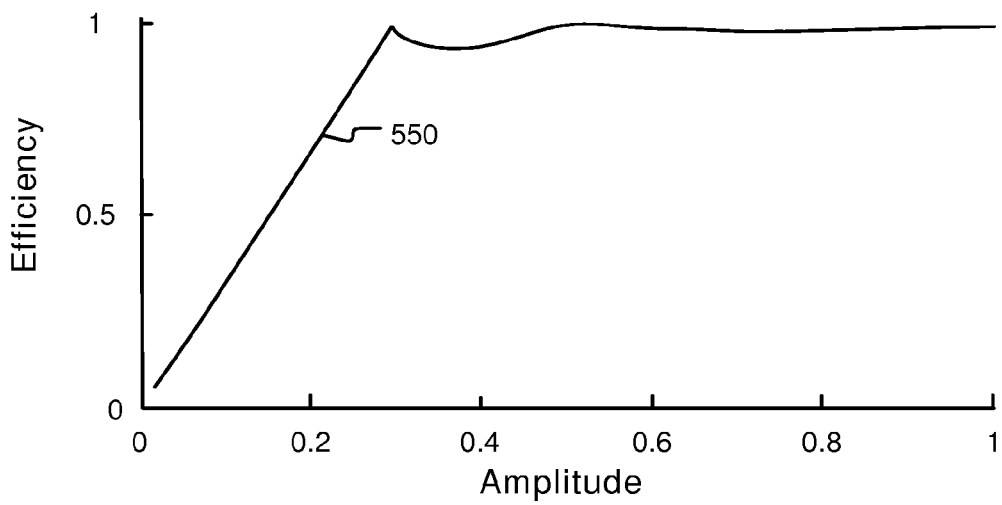
FIG. 7 is a diagram showing the efficiency of the multi-stage amplifier of FIG. 5, as a function of the output voltage amplitude.

FIGS. 6C and 6D are diagrams showing the phases (in radians) of the output currents and voltages, respectively. In FIG. 6C, curve 530 represents the phase of the current output from transistor 501, curve 532 represents the phase of current output from transistor 502, and curve 534 represents the phase of the current output from transistor 503. In FIG. 6D, curve 540 represents the phase of the current output from transistor 501, curve 542 represents the phase of current output from transistor 502, and curve 544 represents the phase of the current output from transistor 503. FIG. 7 depicts a diagram of the relative efficiency 550 of the amplifier 500 (based on a linear RF current to DC current relationship).

This second exemplary amplifier 500 demonstrates another beneficial behavior obtainable by the invention: the size of the active transistor(s) can be made less than that of the prior art amplifiers. This is seen by that the first transistor's output current is only linear below 0.5 of the maximum output amplitude, and constant above. By contrast, "first" transistors of prior amplifiers (e.g., see reference 7) have linear current in the entire output amplitude range. This limitation in output current means that the first transistor 501 can be smaller and therefore have lower shunt loss (everything else being equal).

Figure 8:
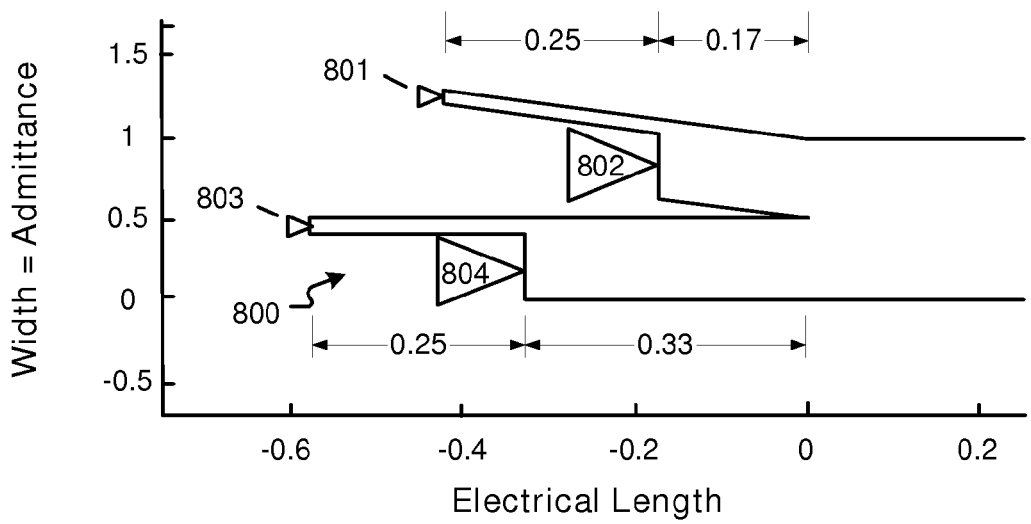
FIG. 8 is a high level diagram depicting an exemplary embodiment of a four-transistor amplifier.

FIG. 8 shows a multi-stage amplifier 800 according to the third exemplary embodiment, which in some embodiments includes four transistors 801-804 and incorporates both the abovementioned benefits. The amplifier 800 includes two branches, with each branch comprising a first transistor 801 or 803 connected by first narrow quarter wavelength transmission line section (or equivalent circuit) to a second transistor 802 or 804. The second transistor in the first branch 802 is connected by a 0.17 wavelength transmission line to the common output. The second transistor 804 in the second branch is connected by a 0.33 wavelength transmission line to the common output (at electrical length zero).

The amplifier 800 may have size-wise symmetry, which may be exploited when determining the lengths or equivalent lengths of transmission lines between the transistors. For example, transistors 801 and 803 may be about the same size, and transistors 802 and 804 may be about the same size. For such symmetrical transistor structures (four, six, . . . ), the lengths of the inner transmission lines may be determined such that they sum about 0.5 wavelengths, or equivalent circuits to about 0.5 equivalent wavelengths.

Figure 9A:
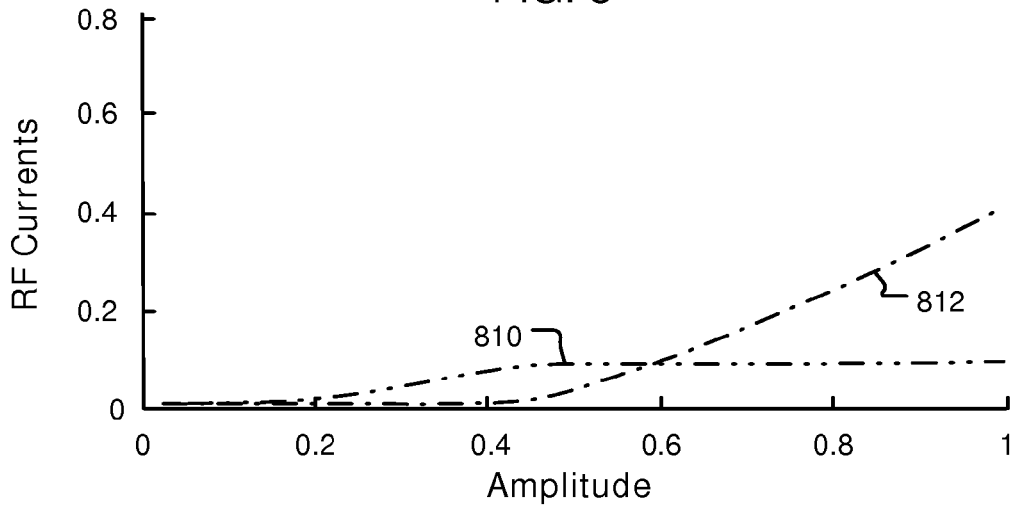
FIGS. 9A-9D are diagrams showing the amplitudes and phases of output currents and voltages from the individual amplifiers of FIG. 8.
Figure 9B:
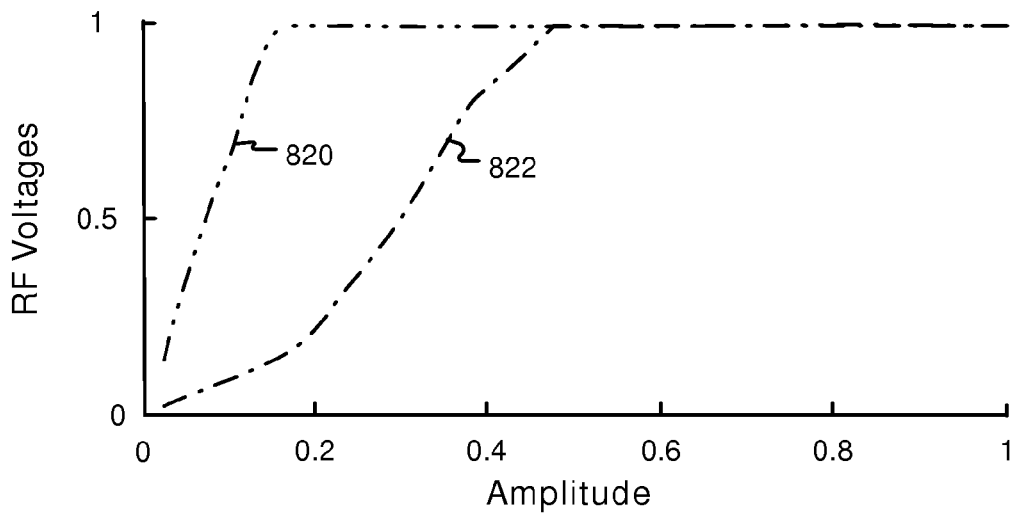

FIGS. 9A and 9B respectively depict the amplitudes of the current and voltages of the transistor pairs. In FIG. 9A, curve 810 represents output current from either transistor 801 or transistor 802 of the transistor pair 801/802, and curve 812 represents output current from either transistor 803 or transistor 804 of the transistor pair 803/804. In FIG. 9B, curve 820 represents output voltage from either transistor 801 or transistor 802 of the transistor pair 801/802, and curve 822 represents output voltage from either transistor 803 or transistor 804 of the transistor pair 803/804.

Figure 9C:
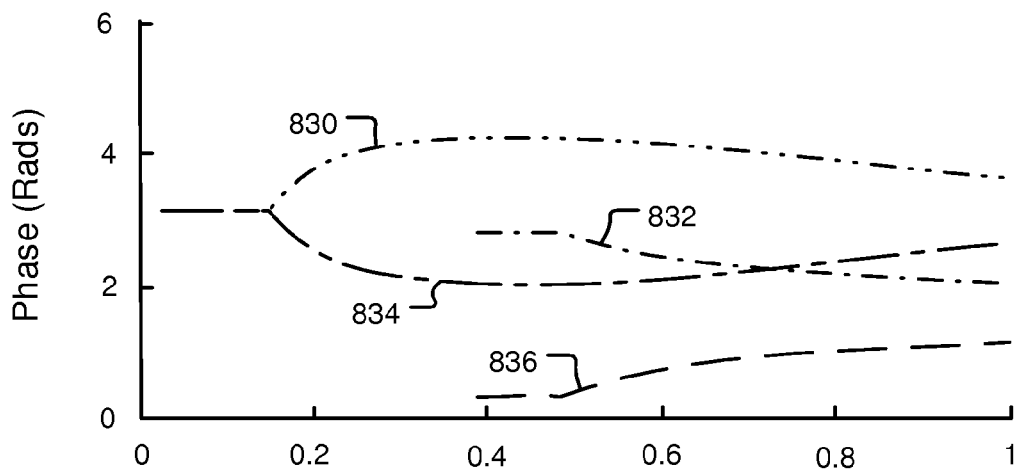
Figure 9D:
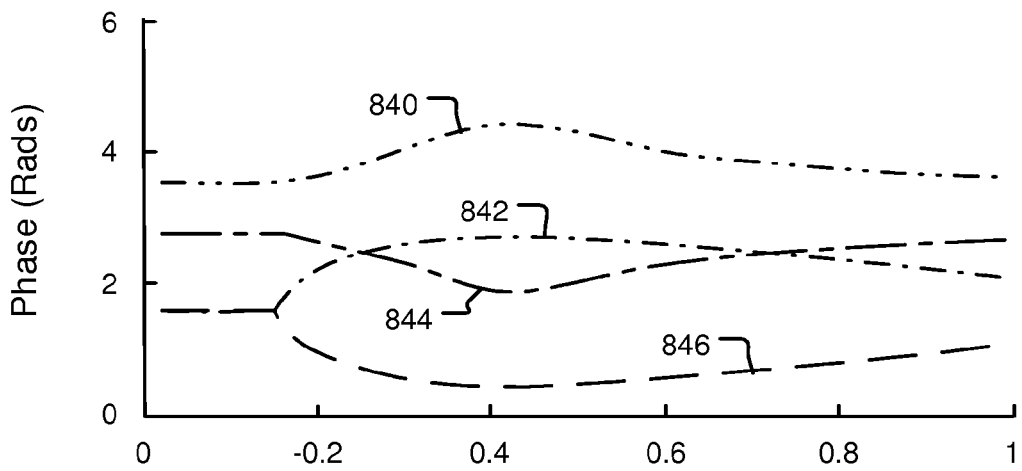

FIGS. 9C and 9D are diagrams showing the phases (in radians) of the voltages and current, respectively. In FIG. 9C, curve 830 represents the phase of the current output from transistor 801, curve 832 represents the phase of current output from transistor 802, curve 834 represents the phase of the current output from transistor 803, and curve 836 represents the phase of the current output from transistor 804. In FIG. 9D, curve 840 represents the phase of the voltage output from transistor 801, curve 842 represents the phase of voltage output from transistor 802, curve 844 represents the phase of the voltage output from transistor 803, and curve 846 represents the phase of the voltage output from transistor 804.

Figure 10:
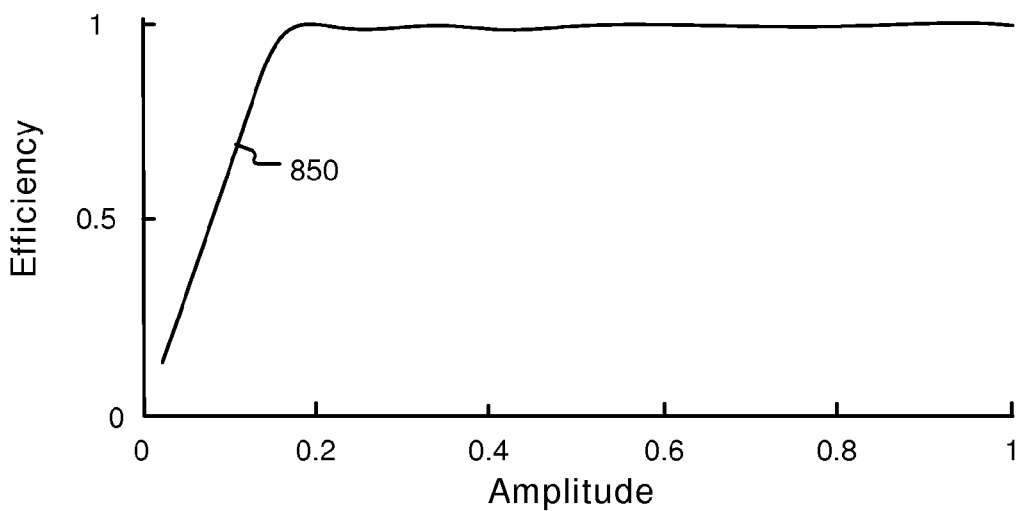
FIG. 10 is a diagram showing the efficiency of the multi-stage amplifier of FIG. 8, as a function of the output voltage amplitude.

The voltage amplitudes at the second transistor 802 and forth transistor 804 are sub-linear below an output amplitude of 0.38 of the maximum, and limited above 0.48 of the maximum output amplitude. The output current of the first and third transistors are limited above 0.48 of maximum amplitude. This means that the sizes of the first transistor 801 and the third transistor 803 can be made very small, in this case at 18% of the total output power capability of the amplifier system. This amplifier is thus much less sensitive to shunt loss than a 4-transistor double-Chireix system of prior art. FIG. 10 shows the relative efficiency 850 for the normalized outputs of the amplifier 800.

Figure 11A:
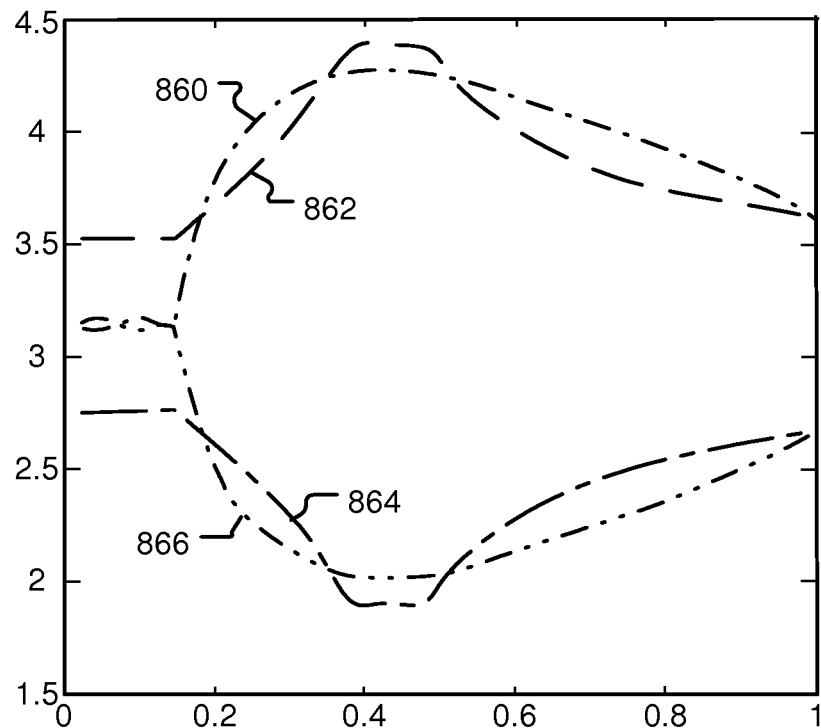
FIGS. 11A and 11B are diagrams showing phases of current and voltages of transistor pairs in the four-transistor amplifier of FIG. 8.
Figure 11B:
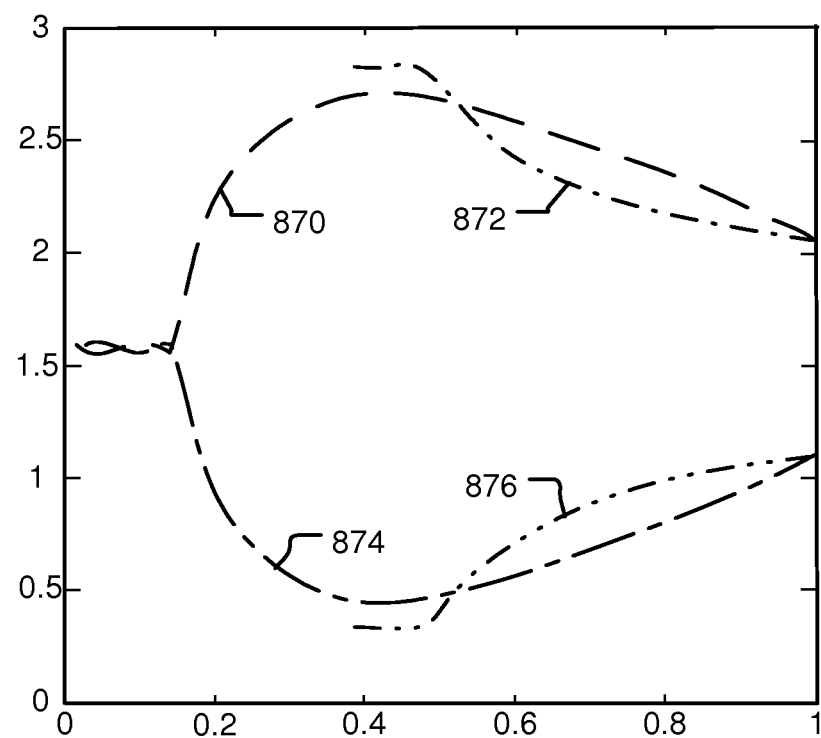

The Chireix action of the system is different from that in prior art amplifiers, which can be seen when the currents and voltages of the transistor pairs are plotted together. FIG. 11A depicts the phases of currents and voltages of the first pair of transistors and FIG. 11B shows the phases of currents and voltages of the second pair.

It can be seen that the second pair 803/804 shows the same (qualitative) behavior as prior art amplifiers in the region in which the second pair is active; phase differences between transistors decreasing towards higher amplitude for both current and voltage. The first transistor pair (first and third transistors) has increasing phase difference in a lower region and decreasing phase difference in a higher region of amplitude. This behavior is entirely different from that of prior art amplifiers of International patent application WO2004/023647. The small phase differences between voltage and current for all four transistors 801-804 gives high efficiency, as shown by the efficiency 850 versus output voltage in FIG. 10.

It will be appreciated that a multi-stage amplifier structure in accordance with the present description may include more than two branches and any number of transistor pairs having Chireix action. Each such transistor of a transistor pair may be driven, for example, a driver for each transistor, to output current over overlapping regions of output amplitude of the dynamic range of the multi-stage amplifier.

With the amplifier structures disclosed herein, voltage amplitudes at shunt loss-sensitive transistors can be kept lower, and sizes of these transistors smaller compared with prior art amplifiers. This means that higher efficiency will be achieved, with practical transistors, than that of the best prior art amplifiers.

The invention may be utilized in any of a number of radio transmitters, including but not limited to broadcast, cellular, and satellite systems. For example, it may be used as the PA for a radio terminal, such as a mobile radio terminal or a base station.

It will be apparent to those skilled in the art that various changes and modifications can be made in the multi-stage amplifiers and amplifier systems of the present invention without departing from the spirit and scope thereof. Thus, it is intended that the present invention cover the modifications of this invention provided they come within the scope of the appended claims and their equivalents.

What is claimed is:

1. A multi-stage amplifier structure, comprising:
a first branch connected to an output node, said first branch including two transistor amplifiers, wherein outputs of the two transistor amplifiers are connected to one another with a quarter wavelength transmission line or circuit equivalent of a quarter wavelength transmission line, wherein the two transistor amplifiers of the first branch comprise,
an inner transistor amplifier, the output of which is connected to the output node by a partial wavelength transmission line, and
an outer transistor amplifier, the output of which is connected to said inner transistor amplifier by said quarter wavelength transmission line or said circuit equivalent; and
a second branch including at least one further transistor amplifier, an output of which is connected to said output node, said second branch including a partial wavelength transmission line, or circuit equivalent of said partial wavelength transmission line, connected between the output of the further transistor amplifier and the output node wherein the second branch comprises,
an inner transistor amplifier comprising said further transistor amplifier connected to said output node by said partial wavelength transmission line, and
an outer transistor amplifier, the output of which is connected to the output of said inner transistor amplifier by a second quarter wavelength transmission line or circuit equivalent of a quarter wavelength transmission line;
wherein the multi-stage amplifier structure is configured such that Chireix action takes place between at least one of said transistor amplifiers in the first branch and the at least one further transistor amplifier in the second branch.

2. The multi-stage amplifier structure of claim 1, wherein a sum of lengths or equivalent lengths of the said partial wavelength transmission lines is 0.5 wavelengths.

3. The multi-stage amplifier structure of claim 1, comprising three or more branches, wherein each third or more of the branches includes at least one transistor amplifier, an output of which is connected to said output node by a partial wavelength transmission line, or a circuit equivalent to said partial wavelength transmission line.

4. The multi-stage amplifier structure of claim 3, including at least two transistor amplifier pairs having Chireix action, and each said pair are driven to output current over overlapping regions of output amplitude of a dynamic range of the multi-stage amplifier.

5. The multi-stage amplifier structure of claim 1, wherein the circuit equivalent connections between transistor amplifiers in at least one of the branches comprise one of a pi-network, a T-network, and an L-network.

6. A radio terminal comprising the multi-stage amplifier structure according to claim 1.

7. The radio terminal of claim 6, wherein said radio terminal is a mobile radio terminal.

8. The radio terminal of claim 6, wherein said radio terminal is a base station.

9. A multi-stage amplifier structure, comprising:
a first branch connected to an output node, said first branch including at least two transistors, wherein the two transistors are connected to one another with a quarter wavelength transmission line or circuit equivalent of a quarter wavelength transmission line, wherein the two transistors of the first branch comprise,
an inner transistor connected to the output node by a partial wavelength transmission line, and
an outer transistor connected to said inner transistor by said quarter wavelength transmission line or said circuit equivalent; and
a second branch including at least one transistor connected to said output node, said second branch including a partial wavelength transmission line, or circuit equivalent of said partial wavelength transmission line, connected between the transistor and the output node, wherein the second branch comprises,
an inner transistor comprising said transistor connected to said output node by said partial wavelength transmission line, and
an outer transistor connected to said inner transistor by a second quarter wavelength transmission line or circuit equivalent of a quarter wavelength transmission line,
wherein the multi-stage amplifier structure is configured such that Chireix action takes place between at least one transistor in the first branch and at least one transistor in the second branch.

10. The multi-stage amplifier structure of claim 9, wherein a sum of lengths or equivalent lengths of the said partial wavelength transmission lines is 0.5 wavelengths.

11. The multi-stage amplifier structure of claim 9, comprising three or more branches, wherein each third or more of the branches includes at least one transistor connected to said output node by a partial wavelength transmission line, or a circuit equivalent to said partial wavelength transmission line.

12. The multi-stage amplifier structure of claim 11, including at least two transistor pairs having Chireix action, and each said pair are driven to output current over overlapping regions of output amplitude of a dynamic range of the multi-stage amplifier.

13. The multi-stage amplifier structure of claim 9, wherein the circuit equivalent connections between transistors in at least one of the branches comprise one of a pi-network, a T-network, and an L-network.

14. A radio terminal comprising the multi-stage amplifier structure of claim 9.

15. The radio terminal of claim 14, wherein said radio terminal is a mobile radio terminal.

16. The radio terminal of claim 14, wherein said radio terminal is a base station.

17. A multi-stage amplifier structure, comprising:
- a first branch connected to an output node, said first branch including a first inner transistor and a first outer transistor, wherein the first inner transistor and the first outer transistor are connected to one another with a quarter wavelength transmission line or circuit equivalent of a quarter wavelength transmission line, and wherein the first inner transistor is connected to the output node by a partial wavelength transmission line; and
- a second branch including a second inner transistor and a second outer transistor connected to said output node, said second branch including a partial wavelength transmission line, or circuit equivalent of said partial wavelength transmission line, connected between the second inner and outer transistors and the output node, wherein the second inner transistor is connected to said output node by said partial wavelength transmission line, and wherein the second outer transistor is connected to the second inner transistor by a second quarter wavelength transmission line or circuit equivalent of a quarter wavelength transmission line; and
- a third branch including a fifth transistor, wherein an output of the fifth transistor is connected to said output node by a partial wavelength transmission line, or a circuit equivalent to said partial wavelength transmission line;

wherein the first and/or second branches are configured such that Chireix action takes place between at least one of the first inner and/or outer transistors in the first branch and at least one of the second inner and/or outer transistors in the second branch.

* * * * *

UNITED STATES PATENT AND TRADEMARK OFFICE
CERTIFICATE OF CORRECTION

PATENT NO.       : 8,441,321 B2                                        Page 1 of 1
APPLICATION NO.  : 13/132241
DATED            : May 14, 2013
INVENTOR(S)      : Hellberg It is certified that error appears in the above-identified patent and that said Letters Patent is hereby corrected as shown below:

In the Drawings

In Fig. 3D, Sheet 3 of 8, delete "-0.2" and insert -- 0.2 --, therefor.

In Fig. 6D, Sheet 5 of 8, delete "-0.2" and insert -- 0.2 --, therefor.

In Fig. 9D, Sheet 7 of 8, delete "-0.2" and insert -- 0.2 --, therefor.

In the Specification

In Column 1, Line 37, delete "cos [ωt+cos$^{-1}$ [A(t)]}, S$_2$(t)=cos [ωt-" and insert -- cos {ωt+cos$^{-1}$ [A(t)]}, S$_2$(t)=cos {ωt- --, therefor.

Signed and Sealed this
Twenty-fifth Day of February, 2014

Michelle K. Lee
*Deputy Director of the United States Patent and Trademark Office*